(12) United States Patent
Williams

(10) Patent No.: US 6,745,338 B1
(45) Date of Patent: Jun. 1, 2004

(54) SYSTEM FOR AUTOMATICALLY SELECTING CLOCK MODES BASED ON A STATE OF CLOCK INPUT PIN AND GENERATING A CLOCK SIGNAL WITH AN OSCILLATOR THEREAFTER

(75) Inventor: Timothy J. Williams, Bellevue, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 515 days.

(21) Appl. No.: 09/659,527

(22) Filed: Sep. 12, 2000

(51) Int. Cl.[7] .................................................. G06F 1/08
(52) U.S. Cl. ...................... 713/501; 327/298; 713/500
(58) Field of Search ............................ 713/500, 501; 365/222, 233; 326/93; 327/291, 298

(56) References Cited

U.S. PATENT DOCUMENTS 4,787,064 A * 11/1988 Wagner ...................... 713/600
5,799,177 A * 8/1998 McKenzie et al. ........... 713/501
5,818,878 A * 10/1998 Tatusch ....................... 375/283
5,991,888 A * 11/1999 Faulkner et al. ............. 713/501
6,014,752 A * 1/2000 Hao et al. .................... 713/500
6,104,225 A * 8/2000 Taguchi et al. .............. 327/298
6,219,797 B1 * 4/2001 Liu et al. ..................... 713/500

FOREIGN PATENT DOCUMENTS

JP          05244135 A   *   9/1993   ............. H04L/7/00

OTHER PUBLICATIONS

Parodi, C.G. et al.–"A Non–Enumerative Path Delay Fault Simulator for Sequential Circuits "–Test Conference, 1998. Proceedings. International , Oct. 18–23, 1998, Page(s): 934–943.*

* cited by examiner

Primary Examiner—Thomas Lee
Assistant Examiner—Thuan Du
(74) Attorney, Agent, or Firm—Christopher P. Maiorana, P.C.

(57) ABSTRACT

An apparatus comprising a circuit configured to automatically select a clock mode in response to a state of a clock input.

18 Claims, 3 Drawing Sheets

SYSTEM FOR AUTOMATICALLY SELECTING CLOCK MODES BASED ON A STATE OF CLOCK INPUT PIN AND GENERATING A CLOCK SIGNAL WITH AN OSCILLATOR THEREAFTER

FIELD OF THE INVENTION

The present invention relates to a method and/or architecture for selecting clock modes generally and, more particularly, to a method and/or architecture for automatically selecting clock modes.

BACKGROUND OF THE INVENTION

Conventional universal serial bus (USB) microcontroller chips include an externally-based oscillator to provide an accurate clock for timing internal operations. The externally-based oscillators typically consist of a high-value resistance and an external timing component (i.e., a crystal or ceramic resonator) connected between an input and an output of an inverting amplifier. A growing number of microcontroller chips have an internal oscillator that can provide an accurate clock with no external timing component.

The option to operate from either an internal or external-based clock normally requires user firmware to explicitly select between the two clock sources. The firmware requirement can require that separate code be generated in order to work with both varieties of microcontrollers. The generation of separate code can include qualification overhead.

If an internal clock mode is added to a cost-reduction version of a chip, the internal clock cannot be readily implemented without changing the firmware. A change in the firmware can require burdensome intervention by the developer to change and qualify the new firmware. The additional firmware development burden can reduce the attractiveness of adding an internal clock mode to a cost-reduction chip.

A solution that allows chips supporting both internal and external-based clock oscillators to automatically select the clock source based on connections at the clock input would be desirable.

SUMMARY OF THE INVENTION

The present invention concerns an apparatus comprising a circuit configured to automatically select a clock mode in response to a state of a clock input.

The objects, features and advantages of the present invention include providing a method and/or architecture for automatically selecting clock modes that may (i) require no firmware changes to switch between internal-based and external-based clock modes, (ii) select a clock mode automatically, based on the presence or absence of an external timing element, (iii) select between internal-based and external-based clock modes without firmware intervention, (iv) use the signal characteristics at an oscillator pin to determine the connected devices and the desired clock mode, (v) select a clock mode at power-up, (vi) provide fault-tolerance to failure of an external timing component, (vii) provide an indication of the clock mode that is operating, and/or (viii) select an internal clock when a clock input is grounded.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
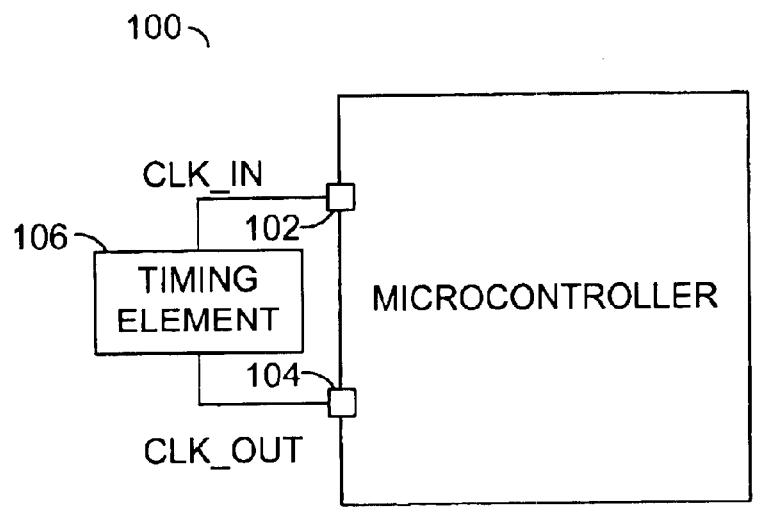
FIG. 1 is a block diagram illustrating a preferred embodiment of the present invention.

Referring to FIG. 1, a block diagram of a circuit 100 is shown in accordance with a preferred embodiment of the present invention. The circuit 100 may be, in one example, a microcontroller chip configured to support both an internal and an external-based clock. However, other types of chips that support both an internal and an external based clock may be implemented accordingly to meet the design criteria of a particular application. The circuit 100 may have an input pin 102 that may receive a signal (e.g., CLK_IN) and an output pin 104 that may present a signal (e.g., CLK_OUT). The signals CLK_IN and CLK_OUT may be clock signals. An external precision timing component 106 (e.g., a crystal, ceramic resonator, or other appropriate precision timing component) may be connected between the input 102 and the output 104. The circuit 100 may be configured to operate using an externally-based clock when the external timing component 106 is connected. When the pin 102 is unconnected or connected to a voltage supply ground (e.g., VSS), the circuit 100 may be configured to operate using an internal clock. The circuit 100 may be configured to select a clock mode in response to (i) the pin 102 being grounded or (ii) signal characteristics at the pin 102. In one example, the circuit 100 may be configured to select between the internal and external-based oscillators at power-up. The circuit 100 may be configured, in one example, to disable the external-based oscillator when using the internal based oscillator.

Figure 2:
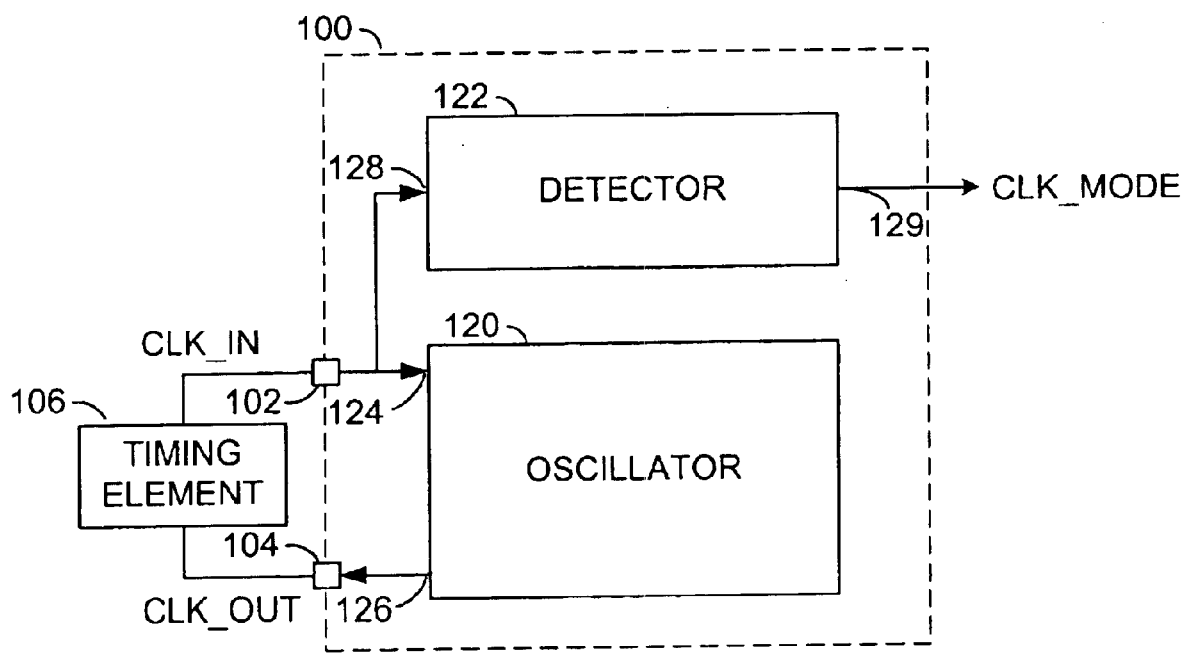
FIG. 2 is a detailed block diagram illustrating a preferred embodiment of the present invention.

Referring to FIG. 2, a detailed block diagram of the circuit 100 is shown. In one example, the circuit 100 may comprise a circuit 120 and a circuit 122. The circuit 120 may be an external-based clock oscillator circuit. The circuit 122 may be a detector circuit. The circuit 120 may have an input 124 that may receive the signal CLK_IN and an output 126 that may present the signal CLK_OUT. The circuit 120 may be configured to generate one or more signals having a frequency controlled by the external timing component 106.

The circuit 122 may have an input 128 that may receive the signal CLK_IN and an output 129 that may present a signal (e.g., CLK_MODE). The signal CLK_MODE may be used as a status signal or a control signal. The signal CLK_MODE may be used to indicate a clock mode selected. For example, a first state of the signal CLK_MODE may indicate that an external clock mode is selected. A second state of the signal CLK_MODE may indicate that an internal clock mode is selected. The circuit 122 may be configured to present the signal CLK_MODE having the first state when the external timing component 106 is detected and the second state when (i) no external timing component or (ii) a ground potential is detected.

Figure 3:
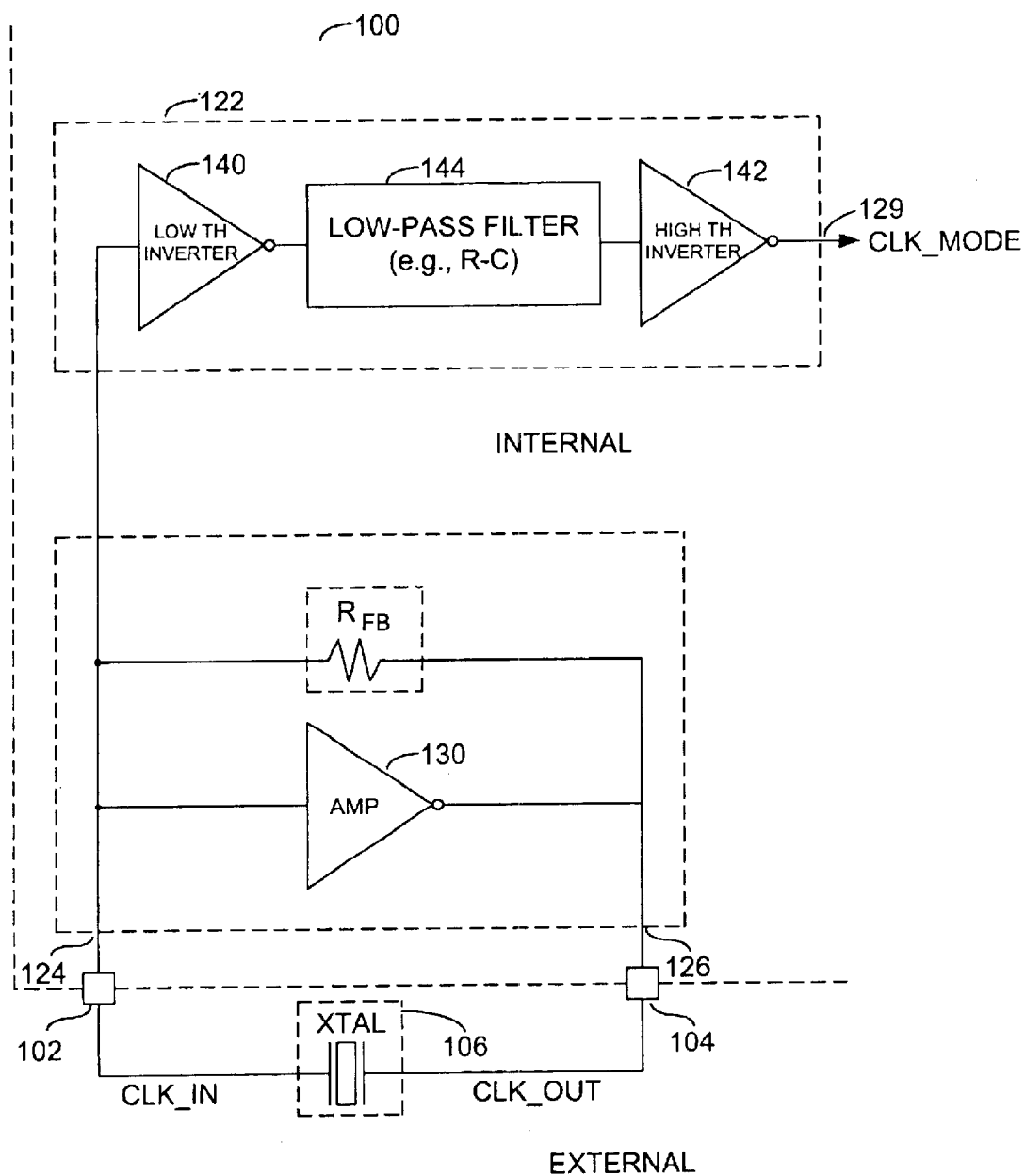
FIG. 3 is a more detailed block diagram illustrating a preferred embodiment of the present invention.

Referring to FIG. 3, a more detailed block diagram of the circuit 100 illustrating a preferred embodiment of the present invention is shown. In one example, the circuit 120 may comprise a circuit 130 and a device 132. The circuit 130 may be implemented as an inverting amplifier circuit. The circuit 130 may have an input that may receive the signal CLK_IN and an output that may present the signal CLK_OUT. The device 132 may be implemented, in one example, as a resistor having a predetermined high-value resistance (e.g., $R_{FB}$). However, other devices may be implemented to meet the design criteria of a particular application. For example, the device 132 may be implemented as one or more transistors configured as a resistor with a predetermined high-value resistance. The device 132 may have a first and a second terminal that may be connected to the input and the output of the circuit 130, respectively.

The external precision timing component 106 may be implemented, in one example, as a crystal. Alternatively, a ceramic resonator or other appropriate precision timing component may be implemented to meet the design criteria of a particular application. The external precision timing component may have a first and a second terminal that may be connected to the input and the output of the circuit 130, respectively. In addition, appropriate capacitance may be added as needed to the terminals of the circuit 130. In one example, the circuit 130, the device 132, and any additional capacitance that may be needed may be implemented on the same chip as the circuit 100.

The circuit 122 may comprise, in one example, a circuit 140, a circuit 142, and a circuit 144. The circuits 140 and 142 may be implemented, in one example, as inverters. The circuit 140 may have a low threshold. The circuit 142 may have a high threshold. In one example, the low threshold inverter 140 may have a threshold set at 40% of a supply voltage (e.g., 0.4*VCC). The high threshold inverter 142 may have a threshold set at, in one example, 60% of the supply voltage (e.g., 0.6*VCC). However, other thresholds may be implemented to meet the design criteria of a particular application. The circuit 144 may be implemented as a low pass filter circuit. In one example, the circuit 144 may comprise resistors and capacitors. However, any appropriate filter circuit may be implemented to meet the design criteria of a particular application. The circuit 140 may have an input that may receive the signal CLK_IN. An output of the circuit 140 may be coupled to an input of the circuit 142. In one example, the output of the circuit 140 may be coupled to the input of the circuit 142 using the circuit 144. The circuit 142 may have an output that may present the signal CLK_MODE.

During an example operation of the circuit 100, the circuit 122 may monitor the signal CLK_IN (or one or more signal characteristics of the input pin 102). The signal CLK_IN may have, in one example, a first state and a second state. For example, the first state may comprise a first predefined condition (e.g., the presence of a clock signal, a voltage level above a predetermined threshold, a frequency above a predetermined level, etc.) and the second state may comprise a second predefined condition (e.g., a clock signal not present, a voltage level below the predetermined threshold, a frequency below the predetermined level, etc.).

When the signal CLK_IN is in the first predefined state (e.g., a DC value of one-half the supply voltage VCC, presence of a predetermined signal amplitude after a predetermined time, etc.), the signal CLK_MODE may be placed in a first state (e.g., asserted). Asserting the signal CLK_MODE may indicate that an external-based clock is present. When the signal CLK_MODE is asserted, the circuit 100 may be configured to select the external-based clock.

When the signal CLK_IN is in the second predefined state (e.g., the pin 102 connected to the voltage supply ground VSS, the detected signal characteristic(s) indicating no clock signal, etc.), the signal CLK_MODE may be placed in a second state (e.g., de-asserted). De-asserting the signal CLK_MODE may indicate that no external based clock is present. When the signal CLK_MODE is de-asserted, the circuit 100 may be configured to select an internal clock. The circuit 100 may be configured to check the signal CLK_IN, in one example, at power-up. However, the circuit 100 may be configured to check the signal continuously or at any appropriate time selected to meet the design criteria of a particular application. For example, the signal CLK_MODE may be used to provide fault tolerance for failure of the external-based clock oscillator.

Figure 4:
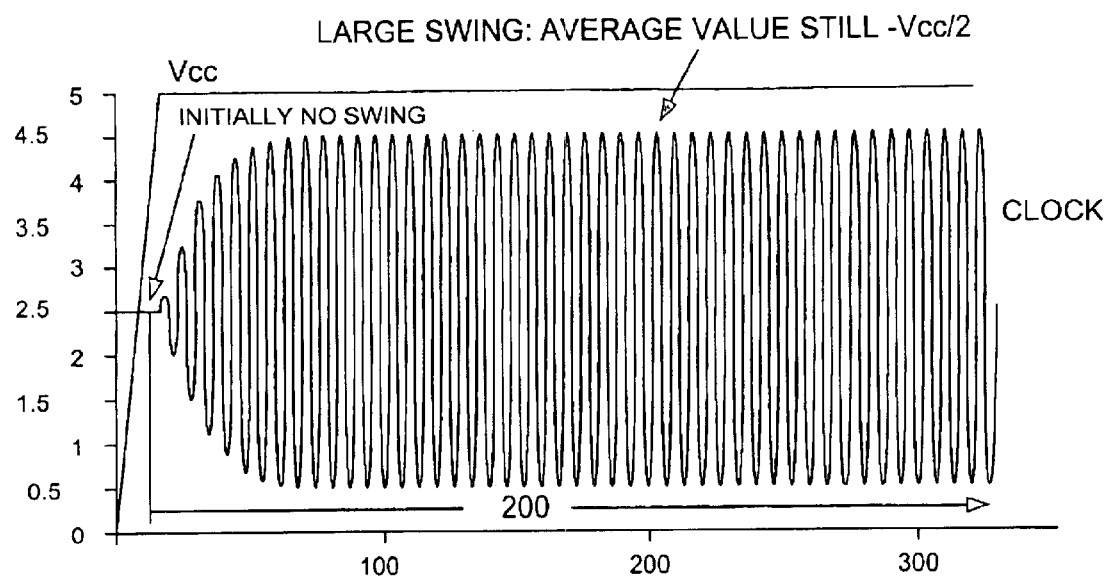
FIG. 4 is a plot illustrating an example waveform of a clock signal at an input or output pin of the circuit 100 of FIG. 1.

Referring to FIG. 4, a plot illustrating an example waveform at the input pin 102 or output pin 104 of the circuit 100 is shown. During operation, the average amplitude of the DC voltage at the input (or output) of the amplifier 130 may be approximately one-half the amplitude of the supply voltage (e.g., VCC/2). The average amplitude of the DC voltage of the amplifier 130 input (or output) may be approximately one-half the amplitude of the supply voltage from shortly after the device is powered up (e.g., the oscillator swing is nearly zero) through the time when the oscillator is fully operational (e.g., swinging approximately rail-to-rail), defined by a portion 200.

The circuit 100 may be configured to select between clock modes (e.g., internal vs. external-based oscillator) when the circuit 122 detects that the external timing component 106 is not connected based on the DC level of the pin 102. When the selection between clock modes is made based on the DC level of the pin 102, the internal clock mode may be selected, in one example, in response to the external timing component 106 being removed and the pin 102 being shorted to ground.

In an alternative embodiment, the circuit 100 may be configured to select a clock mode (e.g., an internal clock mode) in response to just the removal of the external timing component 106. When the external timing component 106 is removed, the pins 102 and 104 will generally sit at a threshold voltage level of the circuit 130 (e.g., approximately VCC/2). In general, no oscillations will build up. The circuit 122 may be configured to detect the lack of the external timing component 106 by a lack of signal amplitude (or other signal characteristics) after a predetermined amount of time.

Using a lack of signal amplitude after a predetermined amount of time to select the clock mode may have some disadvantages under certain conditions. For example, (i) the circuit 122 may require a more complicated design and (ii) the amount of time to wait before evaluating the signal amplitude may be difficult to determine. In general, a start-up time of an oscillator may vary (i) between timing elements, (ii) in response to parasitic board capacitances, and/or (iii) in response to process variations in the circuit 130. However, using a lack of signal amplitude after a predetermined amount of time to select the clock mode may have the advantage that the mode selection may be simply done by connecting or removing the external timing component(s) 106.

Figure 5:
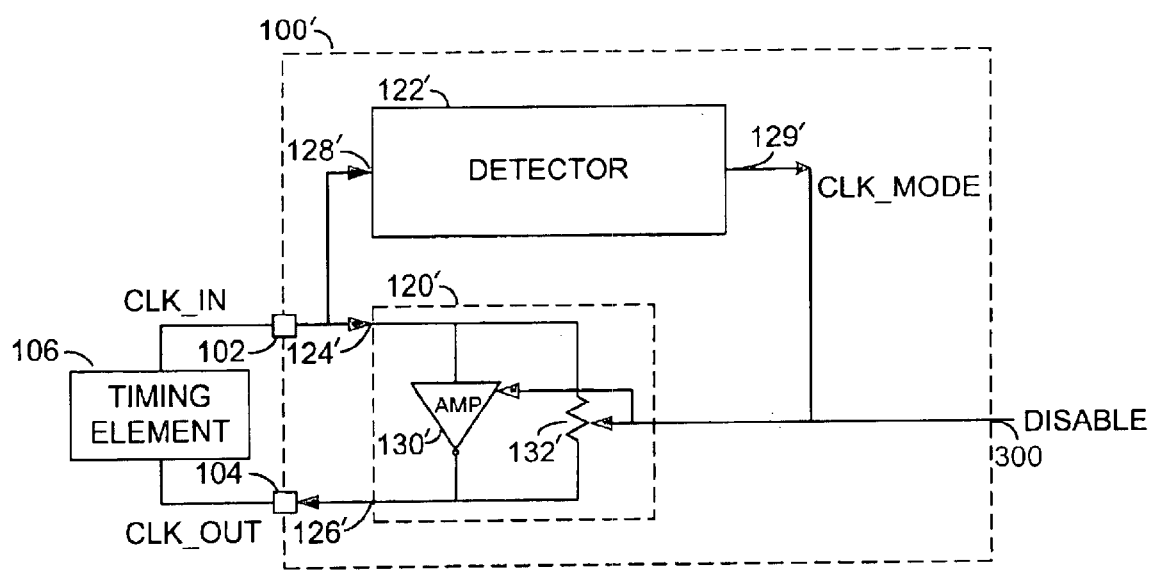
FIG. 5 is a block diagram illustrating an alternative embodiment of the present invention.

Referring to FIG. 5, a block diagram of a circuit 100' illustrating an alternative embodiment of the present invention is shown. The circuit 100' may be implemented similarly to the circuit 100 except that the circuit 100' may have an input 300 that may receive a signal (e.g., DISABLE). The signal DISABLE may be a control signal. The signal DISABLE may be used to disable an external-based clock of the circuit 100'. The circuit 100' may comprise a circuit 120' and a circuit 122'. The circuit 122' may be implemented similarly to the circuit 122. The circuit 120' may be implemented similarly to the circuit 120 except that the circuit 120' may be configured to receive the signal DISABLE. In one example, the signal DISABLE may be presented to the circuit 130' and the device 132'. The circuit 130' and the device 132' may be disabled in response to the signal DISABLE. The signal DISABLE may be, in one example, an external signal. Alternatively, the signal CLK_MODE may be used as the signal DISABLE. The signal DISABLE may be asserted, in one example, in response to a failure to detect an external timing component or lack of external-based clock.

During an example operation of the circuit 100', the circuit 122' may monitor the signal CLK_IN. The signal DISABLE may be de-asserted either automatically (e.g., by a power-on reset), in response to a user input, or in response to any other appropriate control signal. When the signal CLK_IN exceeds a predetermined value after a predetermined time, the signal CLK_MODE may be asserted. Asserting the signal CLK_MODE may indicate that an external-based clock is present. The signal DISABLE may be de-asserted in response to the assertion of the signal CLK_MODE. When an external clock is present, the signal CLK_MODE may be used to maintain the signal DISABLE in a de-asserted state. When the signal CLK_MODE is de-asserted (e.g., no external-based clock), the signal DISABLE may be asserted to turn off the circuit 120'. When the circuit 120' is turned off, the inputs 102 and 104 may be configured as general purpose input and/or output pins or any other appropriate types of pins to meet the design criteria of a particular application. The circuit 100' may be configured to check the signal CLK_IN only at powerup or at any other time.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus configured to automatically select a clock mode in response to a state of a clock input pin, comprising:
    an oscillator circuit configured to generate a clock signal in response to an external timing component connected to said clock input pin; and
    a detection circuit configured to generate an output in response to said state of said clock input pin, wherein said output is generated having a first state when said clock input pin is connected to said external timing component.

2. The apparatus according to claim 1, wherein said apparatus selects either an internal or an external-based clock mode based on said clock input pin.

3. The apparatus according to claim 1, wherein said state of said clock input pin comprises one or more states selected from the group consisting of (i) a state connected to a supply voltage ground, (ii) a state connected to a terminal of a external timing component, and (iii) an unconnected state.

4. The apparatus according to claim 1, wherein said output is generated having a second state when said clock input pin is (i) connected to a voltage supply ground or (ii) unconnected.

5. The apparatus according to claim 1, further comprising a second oscillator circuit configured to generate a second clock signal.

6. The apparatus according to claim 5, wherein said second clock signal is an internal clock signal.

7. The apparatus according to claim 1, wherein said oscillator circuit is dis-enabled in response to a control input.

8. The apparatus according to claim 7, wherein said output is used as said control input.

9. The apparatus according to claim 1, wherein said external timing component is selected from the group consisting of crystals and ceramic resonators.

10. A method for automatically selecting a clock mode comprising the steps of:
    (A) monitoring a clock input pin;
    (B) selecting a first clock mode when said clock input pin is in a first predefined state;
    (C) selecting a second clock mode when said clock input pin is in a second predefined state; and
    (D) generating a clock signal with an oscillator in response to the selected first clock mode or second clock mode.

11. The method according to claim 10, wherein said first predefined state comprises one or more states selected from the group consisting of an amplitude exceeding a predetermined threshold voltage, a frequency exceeding a predetermined threshold frequency, and a clock signal being present.

12. The method according to claim 10, wherein said second predefined state comprises one or more states selected from the group consisting of an amplitude below a predetermined threshold voltage, a frequency less than a predetermined threshold frequency, and a clock signal not being present.

13. The method according to claim 10, wherein step (A) comprises the sub-step of:
    (A-1) detecting a voltage supply ground.

14. The method according to claim 10, wherein step (A) comprises the sub-step of:
    (A-1) detecting an external timing component.

15. The method according to claim 10, wherein step (A) comprises the sub-step of:
    (A-1) detecting a voltage characteristic of said clock input pin.

16. The method according to claim 10, wherein step (C) comprises the sub-step of:
    (C-1) disabling one or more components of a clock generator.

17. The method according to claim 16, wherein step (C) further comprises the sub-step of:
    (C-2) configuring one or more clock inputs to one or more alternate functions.

18. An apparatus for automatically selecting a clock mode comprising:
    means for monitoring a clock input pin;
    means for selecting a first clock mode when said clock input pin is in a first predefined state;
    means for selecting a second clock mode when said clock input pin is in a second predefined state; and
    means for generating a clock signal in response to the selected first clock mode or second clock mode, wherein means for generating a clock signal comprises an oscillator.

* * * * *